US012696528B2

(12) United States Patent
Lee et al.

(10) Patent No.: US 12,696,528 B2
(45) Date of Patent: Jul. 28, 2026

(54) SEMICONDUCTOR DEVICES

(71) Applicant: Samsung Electronics Co., Ltd.,
Suwon-si (KR)

(72) Inventors: Dongjin Lee, Seoul (KR); Junhee Lim,
Seoul (KR); Kangoh Yun, Hwaseong-si
(KR); Sohyun Lee, Hwaseong-si (KR)

(73) Assignee: SAMSUNG ELECTRONICS CO.,
LTD., Suwon-si (KR)

( * ) Notice: Subject to any disclaimer, the term of this
patent is extended or adjusted under 35
U.S.C. 154(b) by 490 days.

(21) Appl. No.: 18/133,977

(22) Filed: Apr. 12, 2023

(65) Prior Publication Data

US 2023/0402454 A1 Dec. 14, 2023

(30) Foreign Application Priority Data

Jun. 14, 2022 (KR) ........................ 10-2022-0071919

(51) Int. Cl.
H10D 84/83 (2025.01)
H10D 84/01 (2025.01)
(Continued)

(52) U.S. Cl.
CPC ......... H10D 84/83 (2025.01); H10D 84/0151
(2025.01); H10D 84/038 (2025.01);
(Continued)

(58) Field of Classification Search
CPC .. H10D 84/83; H10D 84/0151; H10D 84/038;
H10D 84/0144; H10D 62/113; H10D
62/115; H10D 84/8314; H01L 21/76229;

H01L 21/76232; H01L 21/76237; H01L
21/76224; H10W 10/0143; H10W
10/0145; H10W 10/0148; H10W 10/17;
H10W 10/014
See application file for complete search history.

(56) References Cited

U.S. PATENT DOCUMENTS

| | | | | | |
|---|---|---|---|---|---|
| 5,473,186 A | * | 12/1995 | Morita | .............. | H01L 21/76224 |
| | | | | | 257/E21.546 |
| 5,972,758 A | * | 10/1999 | Liang | ................ | H01L 21/76264 |
| | | | | | 257/E21.549 |

(Continued)

FOREIGN PATENT DOCUMENTS

| | | |
|---|---|---|
| KR | 10-2004-0038118 A | 5/2004 |
| KR | 1020050069651 A | 7/2005 |

(Continued)

*Primary Examiner* — Andres Munoz
(74) *Attorney, Agent, or Firm* — Muir Patent Law, PLLC

(57) ABSTRACT

A semiconductor device includes a first isolation structure
extending through an upper portion of a substrate and
defining a first active region, a first gate structure on the
substrate, and first source/drain regions at upper portions of
the first active region adjacent to the first gate structure. The
first isolation structure includes an upper isolation pattern
structure and a lower isolation pattern. The upper isolation
pattern structure includes a first isolation pattern and a
second isolation pattern covering a sidewall of the first
isolation pattern. The lower isolation pattern is formed under
and contacting the upper isolation pattern structure, and a
width of the lower isolation pattern is greater than a width
of the upper isolation pattern structure.

17 Claims, 10 Drawing Sheets

(51) Int. Cl.
  *H10D 84/03*      (2025.01)
  *H10W 10/00*      (2026.01)
  *H10W 10/17*      (2026.01)

(52) U.S. Cl.
  CPC ...  *H10W 10/0143* (2026.01); *H10W 10/0145* (2026.01); *H10W 10/0148* (2026.01); *H10W 10/17* (2026.01)

(56)                References Cited

U.S. PATENT DOCUMENTS

| | | | |
|---|---|---|---|
| 6,245,636 B1 * | 6/2001 | Maszara | ........... H01L 21/76264 |
| | | | 257/E21.549 |
| 7,354,812 B2 | 4/2008 | Batra et al. | |
| 8,012,821 B2 | 9/2011 | Ryou et al. | |
| 8,753,956 B2 | 6/2014 | Fumitake et al. | |
| 10,832,983 B2 | 11/2020 | Choi et al. | |
| 2008/0303968 A1 * | 12/2008 | Terada | ................. H10D 30/021 |
| | | | 438/296 |
| 2015/0021700 A1 * | 1/2015 | Huang | ............. H01L 21/30608 |
| | | | 438/424 |

FOREIGN PATENT DOCUMENTS

| | | |
|---|---|---|
| KR | 1020090107184 A | 10/2009 |
| KR | 10-2011-0078891 A | 7/2011 |
| KR | 1020200033713 A | 3/2020 |

* cited by examiner

F I G. 4A
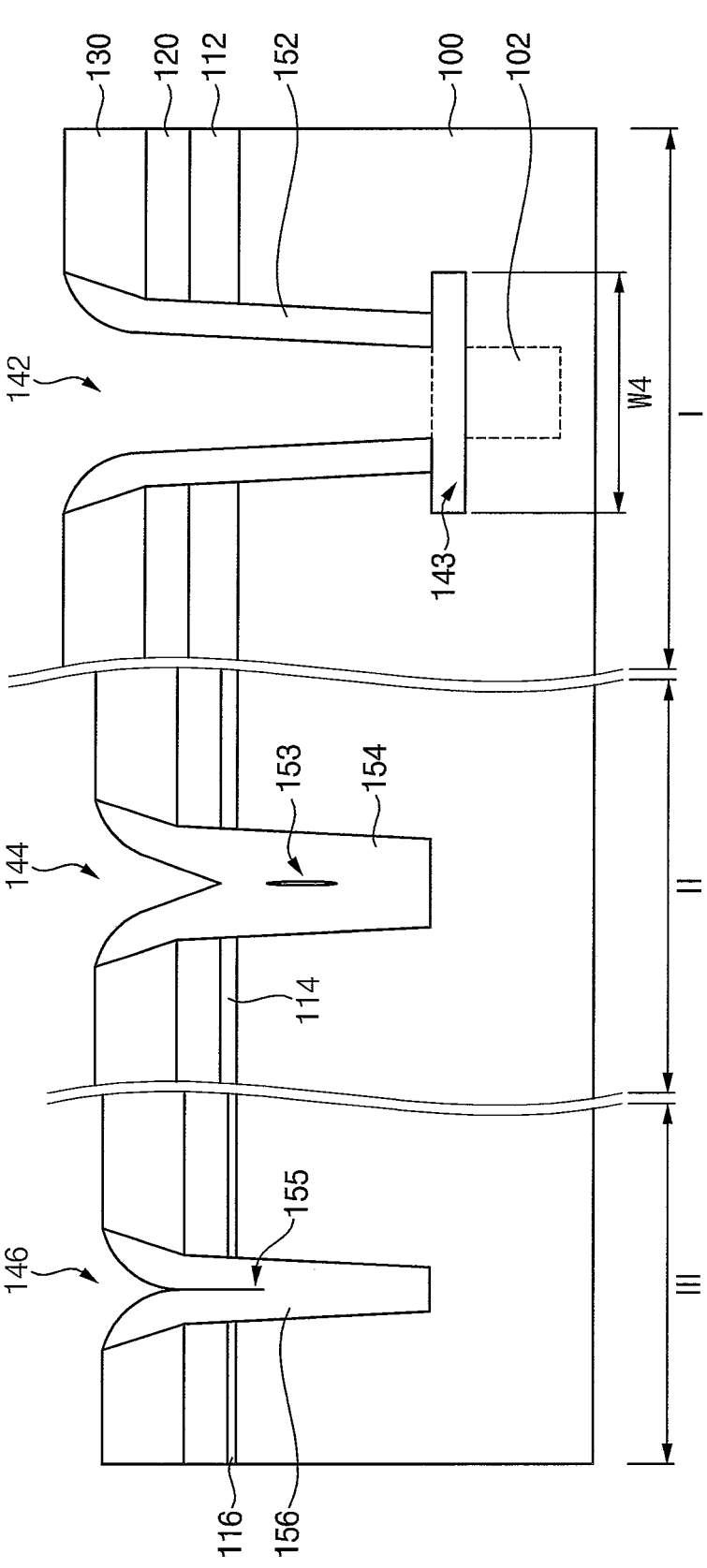

FIG. 7

SEMICONDUCTOR DEVICES

CROSS-REFERENCE TO RELATED APPLICATION

This application claims priority under 35 USC § 119 to Korean Patent Application No. 10-2022-0071919, filed on Jun. 14, 2022 in the Korean Intellectual Property Office (KIPO), the contents of which are herein incorporated by reference in their entirety.

BACKGROUND

1. Field

Example embodiments relate to semiconductor devices. More particularly, example embodiments relate to semiconductor devices having isolation patterns.

2. Description of the Related Art

An isolation layer may be formed on a substrate to define active regions, and transistors may be formed on the active regions. As semiconductor devices have high integration degree, electrical insulative characteristics between neighboring active regions at opposite sides of the isolation layer may be deteriorated.

SUMMARY

Example embodiments provide a semiconductor device having enhanced characteristics.

According to example embodiments, there is provided a semiconductor device. The semiconductor device may include a first isolation structure extending through an upper portion of a substrate and defining a first active region, a first gate structure on the substrate, and first source/drain regions at upper portions of the first active region adjacent to the first gate structure. The first isolation structure may include an upper isolation pattern structure and a lower isolation pattern. The upper isolation pattern structure may include a first isolation pattern and a second isolation pattern covering a sidewall of the first isolation pattern. The lower isolation pattern may be formed under and contacting the upper isolation pattern structure, and a width of the lower isolation pattern may be greater than a width of the upper isolation pattern structure.

According to example embodiments, there is provided a semiconductor device. The semiconductor device may include a first isolation structure, an impurity region, a first gate structure, a first source/drain region, a second isolation structure, a second gate structure, and a second source/drain region. The substrate may include a first region and a second region. The first isolation structure may extend through an upper portion of the first region of the substrate, and may define a first active region. The impurity region may be formed under the first isolation structure in the substrate. The first gate structure may be formed on the first region of the substrate. The first source/drain region may be formed at an upper portion of the first active region adjacent to the first gate structure. The second isolation structure may extend through an upper portion of the second region of the substrate, and may define a second active region. The second gate structure may be formed on the second region of the substrate. The second source/drain region may be formed at an upper portion of the second active region adjacent to the second gate structure. The first isolation structure may include an upper isolation pattern structure and a lower isolation pattern under and contacting the upper isolation pattern structure. A width of the lower isolation pattern may be greater than a width of the upper isolation pattern structure.

According to example embodiments, there is provided a semiconductor device. The semiconductor device may include a first isolation structure extending through an upper portion of a first region of a substrate, which may include the first region, a second region and a third region, and defining a first active region, an impurity region under the first isolation structure in the substrate, a first gate structure on the first region of the substrate, a first source/drain region at an upper portion of the first active region adjacent to the first gate structure, a second isolation structure extending through an upper portion of the second region of the substrate and defining a second active region, a second gate structure on the second region of the substrate, a second source/drain region at an upper portion of the second active region adjacent to the second gate structure, a third isolation structure extending through an upper portion of the third region of the substrate and defining a third active region, a third gate structure on the third region of the substrate, and a third source/drain region at an upper portion of the third active region adjacent to the third gate structure. The first isolation structure may include an upper isolation pattern structure and a lower isolation pattern under and contacting the upper isolation pattern structure. A width of the lower isolation pattern may be greater than a width of the upper isolation pattern structure.

In the method of manufacturing the semiconductor device in accordance with example embodiments, when a trench for forming an isolation structure is formed in the substrate, an ion implantation process may be performed to empower the isolation characteristics. Additionally, the isolation pattern may be formed on the sidewall of the trench, and may serve as a portion of the ion implantation mask, and the width of the impurity region that may be formed by the ion implantation process may be controlled by the thickness of the isolation pattern.

Furthermore, after the ion implantation process, an additional trench having a width greater than that of the trench may be formed under the trench, and the isolation structure may be formed in the trench and the additional trench. Thus, the impurities in the impurity region may be prevented from diffusing into neighboring active regions. Accordingly, the changes of the threshold voltages of transistors on the active regions may decrease.

BRIEF DESCRIPTION OF THE DRAWINGS

FIGS. 2 to 5 are cross-sectional views illustrating a method of manufacturing semiconductor devices in accordance with example embodiments.

FIG. 7 is a cross-sectional view illustrating a method of manufacturing semiconductor devices in accordance with example embodiments.

DETAILED DESCRIPTION OF EMBODIMENTS

Figure 1A:
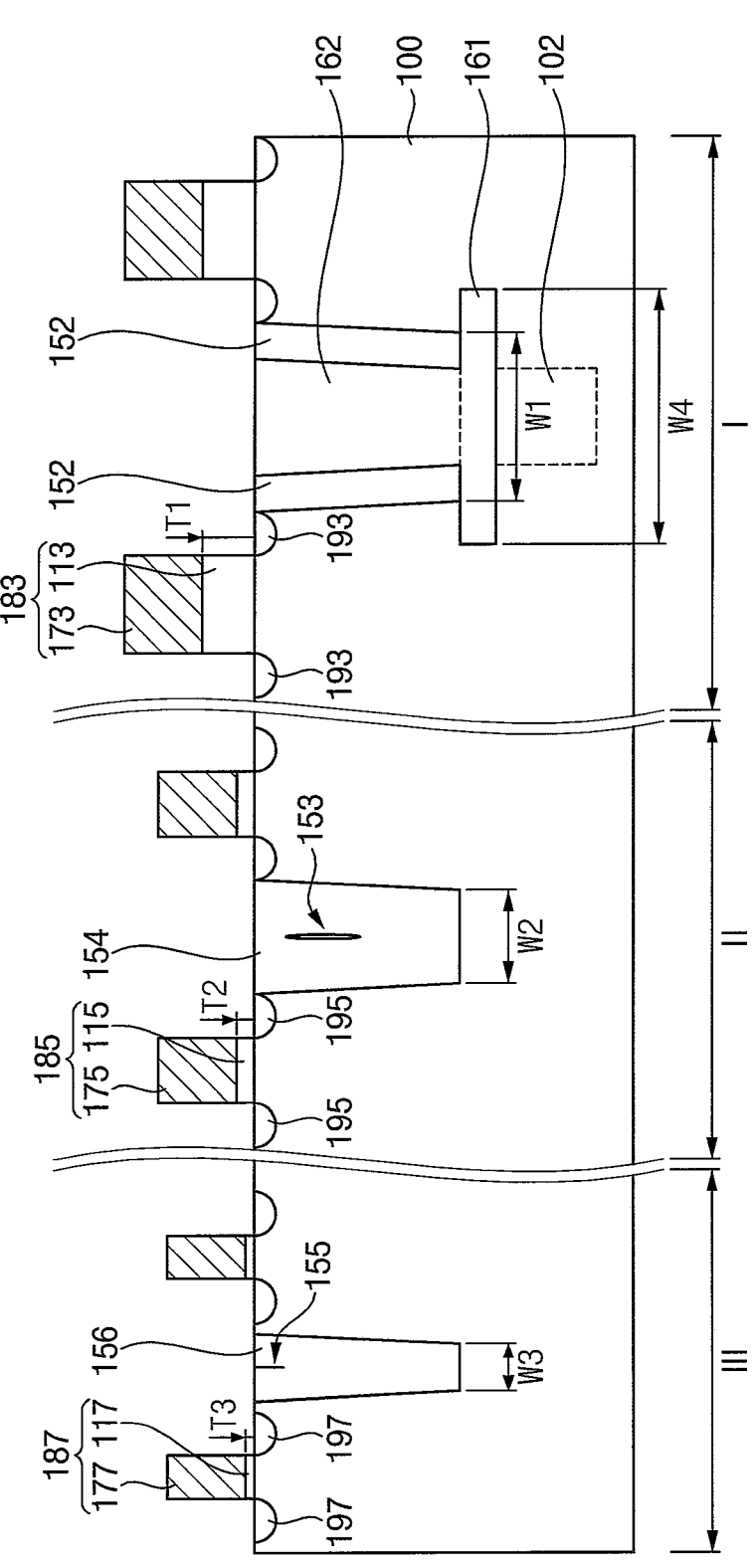
FIGS. 1A and 1B are cross-sectional views illustrating semiconductor devices in accordance with example embodiments.
Figure 1B:
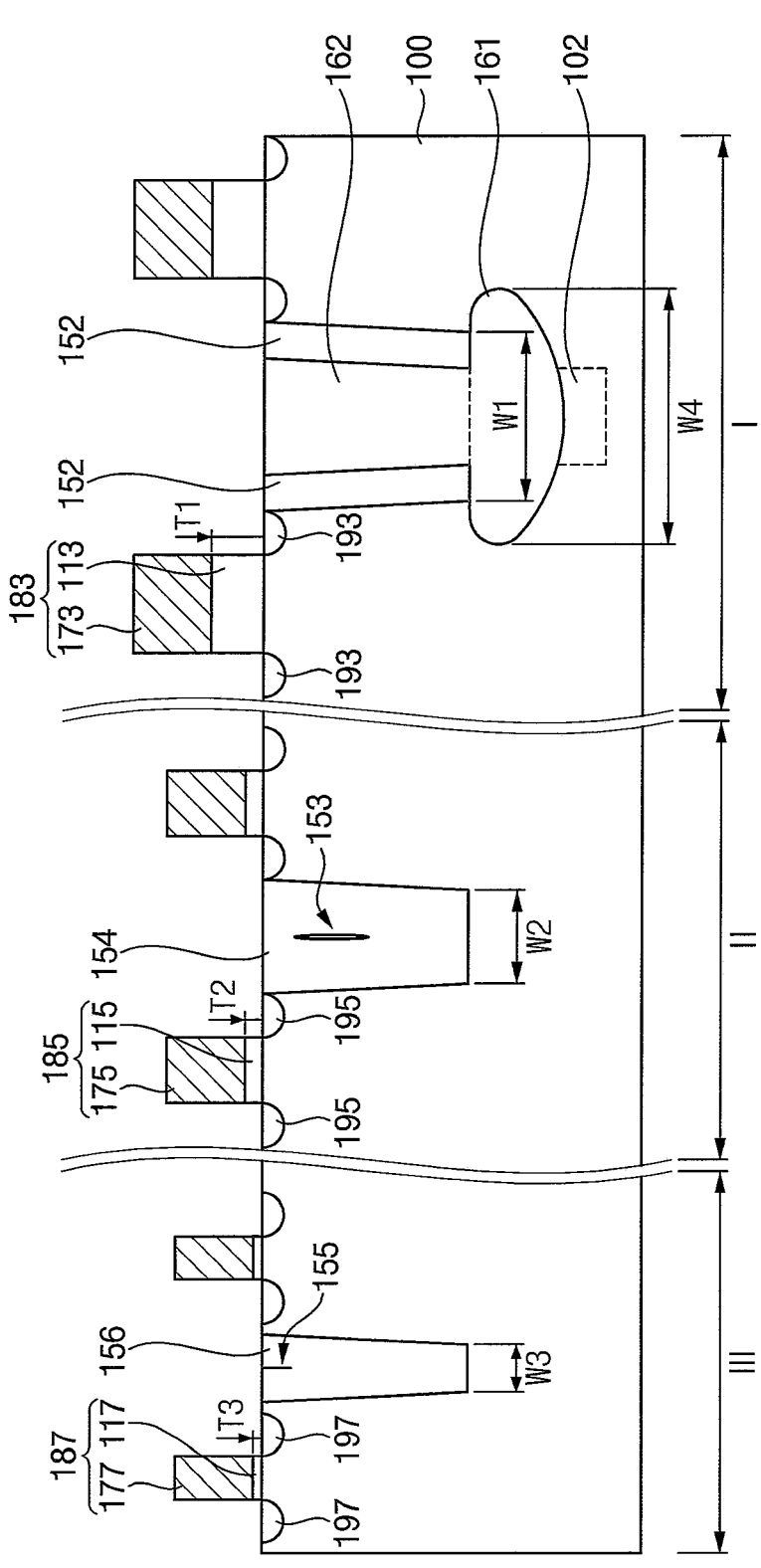

FIGS. 1A and 1B are cross-sectional views illustrating semiconductor devices in accordance with example embodiments.

Referring to FIGS. 1A and 1B, a semiconductor device may include a first isolation structure extending through an upper portion of a first region I of a substrate 100 which includes the first region I, a second region II and a third region III. The first isolation structure may define a first active region. For example, the first isolation structure may be disposed between two first active regions and may form boundaries of the first active regions on opposite side surfaces of the first isolation structure. The semiconductor device may include an impurity region 102 under the first isolation structure in the substrate 100, a first gate structure 183 on the first region I of the substrate 100, and first source/drain regions 193 at upper portions of the first active region. The first gate structure 183 and the first source/drain regions 193 at opposite sides of the first gate structure 183 may form a first transistor.

The semiconductor device may include a second isolation structure extending through an upper portion of the second region II of the substrate 100 and defining a second active region, a second gate structure 185 on the second region II of the substrate 100, and second source/drain regions 195 at upper portions of the second active region. For example, the second isolation structure may be disposed between two second active regions and may form boundaries of the second active regions on opposite side surfaces of the second isolation structure. The second gate structure 185 and the second source/drain regions 195 at opposite sides of the second gate structure 185 may form a second transistor.

The semiconductor device may include a third isolation structure extending through an upper portion of the third region III of the substrate 100 and defining a third active region, a third gate structure 187 on the third region III of the substrate 100, and third source/drain regions 197 at upper portions of the third active region. For example, the third isolation structure may be disposed between two third active regions and may form boundaries of the third active regions on opposite side surfaces of the third isolation structure. The third gate structure 187 and the third source/drain regions 197 at opposite sides of the third gate structure 187 may form a third transistor.

The substrate 100 may include or be formed of a semiconductor material, e.g., silicon, germanium, silicon-germanium, etc., or III-V semiconductor compounds, e.g., GaP, GaAs, GaSb, etc. In some embodiments, the substrate 100 may include or may be a silicon-on-insulator (SOI) substrate or a germanium-on-insulator (GOI) substrate.

In an example embodiment, p-type impurities may be implanted into the substrate 100, and thus the substrate 100 may be a p-type substrate.

In example embodiments, the first, second and third regions I, II and III of the substrate 100 may be a high-voltage region, a middle-voltage region and a low-voltage region, respectively. Thus, maximum values of voltages applied to the first to third transistors may be high, medium, and low respectively. For example, the maximum value of the voltage applied to the first transistor may be greater than the maximum value of the voltage applied to the second transistor, and the maximum value of the voltage applied to the second transistor may be greater than the maximum value of the voltage applied to the third transistor.

In example embodiments, the first isolation structure may include first, fourth and fifth isolation patterns 152, 161 and 162. The first isolation pattern 152 may cover/contact a sidewall of the fifth isolation pattern 162, and the first and fifth isolation patterns 152 and 162 may form an upper isolation pattern structure.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The fourth isolation pattern 161 may be formed under the upper isolation pattern structure to contact a lower surface of the upper isolation pattern structure (e.g., a bottom surface of the first isolation pattern 152 and/or a bottom surface of the fifth isolation pattern 162), and thus may also be referred to as a lower isolation pattern 161. In example embodiments, a fourth width W4 of the lower isolation pattern 161, e.g., in a horizontal direction, may be greater than a first width W1 of the upper isolation pattern structure, e.g., in the horizontal direction. For example, the horizontal direction may be perpendicular to a lengthwise direction of the first gate structure 183 and/or a lengthwise direction of the upper isolation pattern structure. For example, the first width W1 of the upper isolation pattern structure and the fourth width W4 of the lower isolation pattern 161 may be measured on a horizontal boundary plane between the upper isolation pattern structure and the lower isolation pattern 161. For example, the first width W1 may be a width of a bottom surface of the upper isolation pattern structure, and the fourth width W4 may be the biggest width of the lower isolation pattern 161.

The lower isolation pattern 161 may have a shape of a circle, an ellipse, a polygon, etc., in a plan view. In an example embodiment, as shown in FIG. 1A, a lower surface of the lower isolation pattern 161 may be substantially flat. Alternatively, as shown in FIG. 1B, the lower surface of the lower isolation pattern 161 may be curved and convex downwardly.

Terms such as "same," "equal," "planar," "flat," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," "substantially flat," or "substantially planar," may be exactly the same, equal, flat, or planar, or may be the same, equal, flat, or planar within acceptable variations that may occur, for example, due to manufacturing processes.

In example embodiments, the fourth and fifth isolation patterns 161 and 162 may include or be formed of the same or substantially the same material, and may be integrally formed, e.g., as one body without boundary between the fourth and fifth isolation patterns 161 and 162. The first isolation pattern 152 may include or be formed of the same or substantially the same material as the fourth and fifth isolation patterns 161 and 162, or different materials from the fourth and fifth isolation patterns 161 and 162.

In an example embodiment, the fourth and fifth isolation patterns 161 and 162 may include or be formed of silicon oxide, e.g., undoped silicate glass (USG), and the first isolation pattern 152 may include or be formed of an oxide, e.g., ALD oxide.

The impurity region 102 may be formed under the lower isolation pattern 161 included in the first isolation structure, and may include p-type impurities, e.g., boron. If the substrate 100 is a p-type substrate, a concentration of the impurities of the impurity region 102 may be greater than a concentration of the impurities of the substrate 100.

In example embodiments, a width of the impurity region 102, e.g., in the horizontal direction, may be less than at least the first width W1 of the upper isolation pattern structure. Thus, the impurities implanted in the impurity region 102 may be blocked by the lower isolation pattern 161, which may have the fourth width W4 greater than the first width W1 of the upper isolation pattern structure, disposed on the impurity region 102, so as not to diffuse into the first active region.

The first gate structure 183 may include a first gate insulation structure 113 and a first gate electrode 173 stacked in a vertical direction substantially perpendicular to an upper surface of the substrate 100, and the first gate insulation structure 113 may have a first thickness T1 in the vertical direction. For example, the first gate electrode 173 may be formed on and contact a top surface of the first gate insulation structure 113.

The first gate insulation structure 113 may include or be formed of an oxide, e.g., silicon oxide, and the first gate electrode 173 may include or be formed of, e.g., a metal, a metal nitride, a metal silicide, or doped polysilicon.

A first gate mask (not shown) may be formed on the first gate electrode 173, and a first gate spacer (not shown) may be further formed on sidewalls of the first gate electrode 173 and the first gate mask.

The first source/drain region 193 may include or be formed of single crystalline silicon or polysilicon doped with n-type impurities, e.g., phosphorus.

In example embodiments, the second isolation structure may include a second isolation pattern 154. In an example embodiment, a void 153 or seam may be formed in the second isolation pattern 154.

In example embodiments, a second width W2 of the second isolation pattern 154 may be less than the first width W1 of the upper isolation pattern structure. For example, the second width W2 may be a horizontal width of a bottom surface of the second isolation pattern 154. The direction of the horizontal width may be perpendicular to a lengthwise direction of the second isolation pattern 154. In example embodiments, the second isolation pattern 154 may include or be formed of a material the same or substantially the same as that of the first isolation pattern 152, e.g., an oxide such as ALD oxide.

The second gate structure 185 may include a second gate insulation structure 115 and a second gate electrode 175 stacked in the vertical direction, and the second gate insulation structure 115 may have a second thickness T2 in the vertical direction. In example embodiments, the second thickness T2 of the second gate insulation structure 115 may be less than the first thickness T1 of the first gate insulation structure 113. For example, the second gate electrode 175 may be formed on and contact a top surface of the second gate insulation structure 115.

In example embodiments, an upper surface of the second gate structure 185 may be lower than an upper surface of the first gate structure 183. A width of the second gate structure 185 may be less than a width of the first gate structure 183. However, the inventive concept is not limited thereto. For example, the widths of the first and second gate structures 183 and 185 may be measured in a horizontal direction perpendicular to a lengthwise direction of the first and/or second gate structures.

In an example embodiment, the second gate insulation structure 115 and the second gate electrode 175 may include or be formed of materials the same or substantially the same as those of the first gate insulation structure 113 and the first gate electrode 173, respectively.

A second gate mask (not shown) may be formed on the second gate electrode 175, and a second gate spacer (not shown) may be further formed on sidewalls of the second gate electrode 173 and the second gate mask.

The second source/drain region 195 may include or be formed of single crystalline silicon or polysilicon doped with n-type impurities, e.g., phosphorus.

In example embodiments, the third isolation structure may include a third isolation pattern 156. In an example embodiment, a seam 155 may be formed in the third isolation pattern 156.

In example embodiments, a third width W3 of the third isolation pattern 156 may be less than the second width W2 of the second isolation pattern 154. For example, the second and third widths of the second and third isolation patterns 154 and 156 may be measured in a horizontal direction perpendicular to a lengthwise direction of the second and third isolation patterns 154 and 156. In example embodiments, the third isolation pattern 156 may include or be formed of a material the same or substantially the same as that of the second isolation pattern 154, e.g., an oxide such as ALD oxide.

The third gate structure 187 may include a third gate insulation structure 117 and a third gate electrode 177 stacked in the vertical direction, and the third gate insulation structure 117 may have a third thickness T3 in the vertical direction. In example embodiments, the third thickness T3 of the third gate insulation structure 117 may be less than the second thickness T2 of the second gate insulation structure 115. For example, the third gate electrode 177 may be formed on and contact a top surface of the third gate insulation structure 117.

In example embodiments, an upper surface of the third gate structure 187 may be lower than the upper surface of the second gate structure 185. A width of the third gate structure 187, e.g., in a horizontal direction perpendicular to a lengthwise direction of the third gate structure 187, may be less than a width of the second gate structure 185, e.g., in a horizontal direction perpendicular to a lengthwise direction of the second gate structure 185, however, the inventive concept is not limited thereto.

In an example embodiment, the third gate insulation structure 117 and the third gate electrode 177 may include or be formed of materials the same or substantially the same as those of the second gate insulation structure 115 and the second gate electrode 175, respectively.

A third gate mask (not shown) may be formed on the third gate electrode 177, and a third gate spacer (not shown) may be further formed on sidewalls of the third gate electrode 177 and the third gate mask.

The third source/drain region 197 may include or be formed of single crystalline silicon or polysilicon doped with n-type impurities, e.g., phosphorus.

In the semiconductor device, the impurity region 102 may be formed under the first isolation structure in the first region I of the substrate 100 to which a relatively high voltage is applied, and thus isolation characteristics between the first active regions at opposite sides of the impurity region 102 may be improved.

If the impurities in the impurity region 102 diffuses into the first active regions, the body effect may be increased, and threshold voltages of the first transistors on the first active regions may be changed. However, in example embodiments, the lower isolation pattern 161 on the impurity region 102 may have the width greater than that of the impurity region 102, so that the diffusion of the impurities from the impurity region 102 into the first active regions may be prevented.

FIGS. 2 to 5 are cross-sectional views illustrating a method of manufacturing semiconductor devices in accordance with example embodiments.

Figure 2:
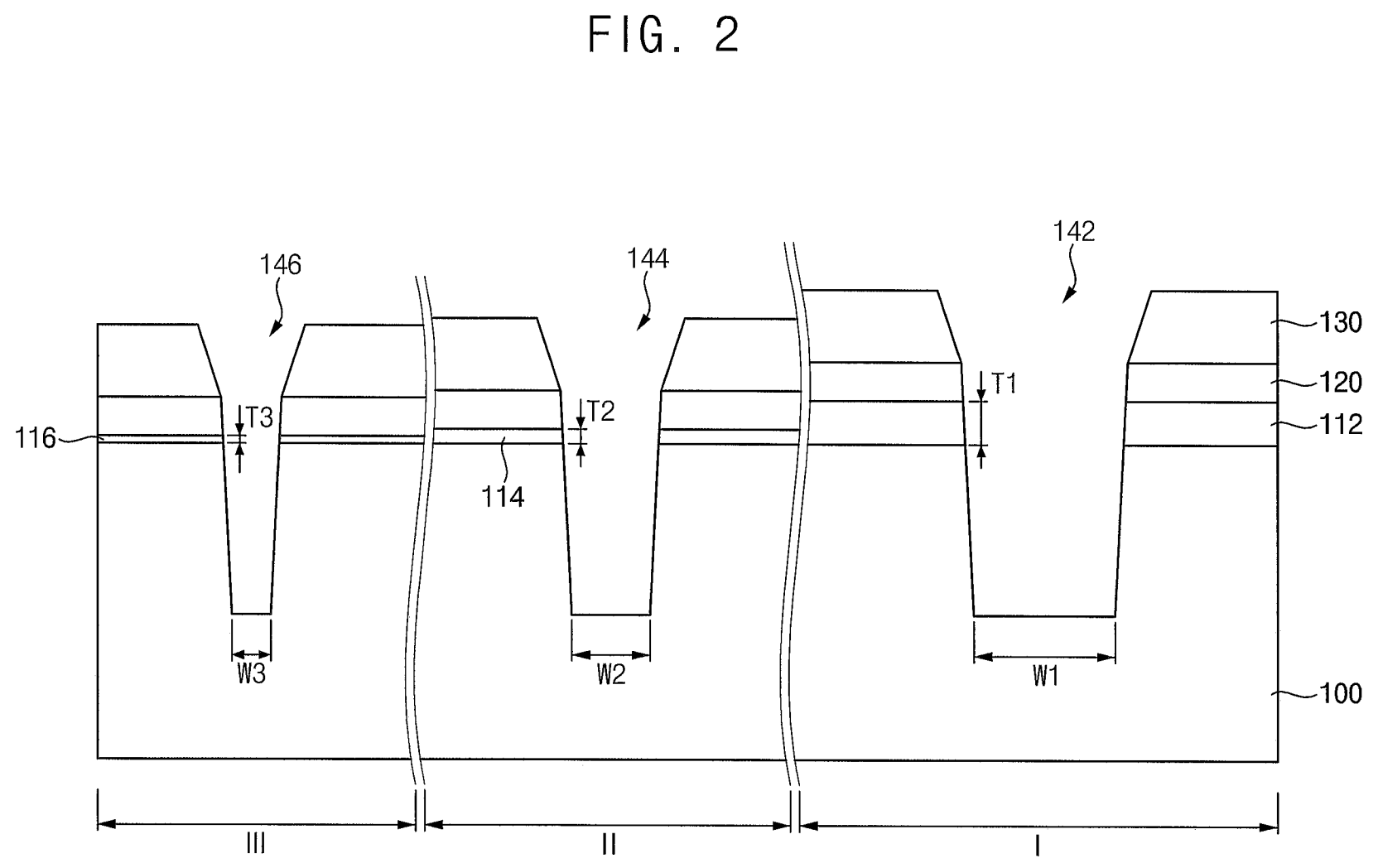

Referring to FIG. 2, first to third gate insulation layer structures 112, 114 and 116 may be formed on respective first to third regions I, II and III of a substrate 100.

In an example embodiment, a preliminary first gate insulation layer may be formed on the substrate 100, portions of the preliminary first gate insulation layer on the second and third regions II and III of the substrate 100 may be removed so that portions of the preliminary first gate insulation layer on the first region I of the substrate 100 may remain to form a first gate insulation layer on the first region I of the substrate 100.

A preliminary second gate insulation layer may be formed on the substrate 100 and the first gate insulation layer, and a portion of the preliminary second gate insulation layer on the third region III of the substrate 100 may be removed so that portions of the preliminary second gate insulation layer on the first gate insulation layer and on the second region II of the substrate 100 may remain to form a second gate insulation layer on the first gate insulation layer on the first region I of the substrate 100 and on the second region II of the substrate 100.

A third gate insulation layer may be formed on the first and second gate insulation layers and on the third region III of the substrate.

Thus, the first gate insulation layer structure 112 including the first to third gate insulation layers sequentially stacked may be formed on the first region I of the substrate 100, the second gate insulation layer structure 114 including the second and third gate insulation layers sequentially stacked may be formed on the second region II of the substrate 100, and the third gate insulation layer structure 116 including the third gate insulation layer may be formed on the third region II of the substrate 100.

In example embodiments, the first to third gate insulation layers may include or be formed of the same or substantially the same material, and thus the first to third gate insulation layers sequentially stacked on the first region I of the substrate and/or the second and third gate insulation layers sequentially stacked on the second region II of the substrate may be merged. The first to third gate insulation layers may include or be formed of an oxide, e.g., silicon oxide.

In example embodiments, the second gate insulation layer structure 114 may have a second thickness T2 greater than a third thickness T3 of the third gate insulation layer structure 116, and the first gate insulation layer structure 112 may have a first thickness T1 greater than the second thickness T2 of the second gate insulation layer structure 114.

A pad layer 120 and a mask layer may be sequentially formed on the first to third gate insulation layer structures 112, 114 and 116, a photoresist pattern may be formed on the mask layer, and an etching process may be performed using the photoresist pattern as an etching mask to form a mask 130.

The pad layer 120 may include or be formed of, e.g., polysilicon, and the mask layer may include or be formed of an oxide, e.g., silicon oxide or an insulating nitride, e.g., silicon nitride.

An etching process may be performed using the mask 130 as an etching mask to remove portions of the pad layer 120, the first to third gate insulation layer structures 112, 114 and 116 and an upper portion of the substrate 100, so that first to third trenches 142, 144 and 146 may be formed in the respective first to third regions I, II and III of the substrate 100.

In example embodiments, a second width W2 of the second trench 144 in a horizontal direction perpendicular to a lengthwise direction of the second trench 144 may be greater than a third width W3 of the third trench 146 in a horizontal direction perpendicular to a lengthwise direction of the third trench 146, and a first width W1 of the first trench 142 in a horizontal direction perpendicular to a lengthwise direction of the first trench 142 may be greater than the second width W2 of the second trench 144.

Figure 3:
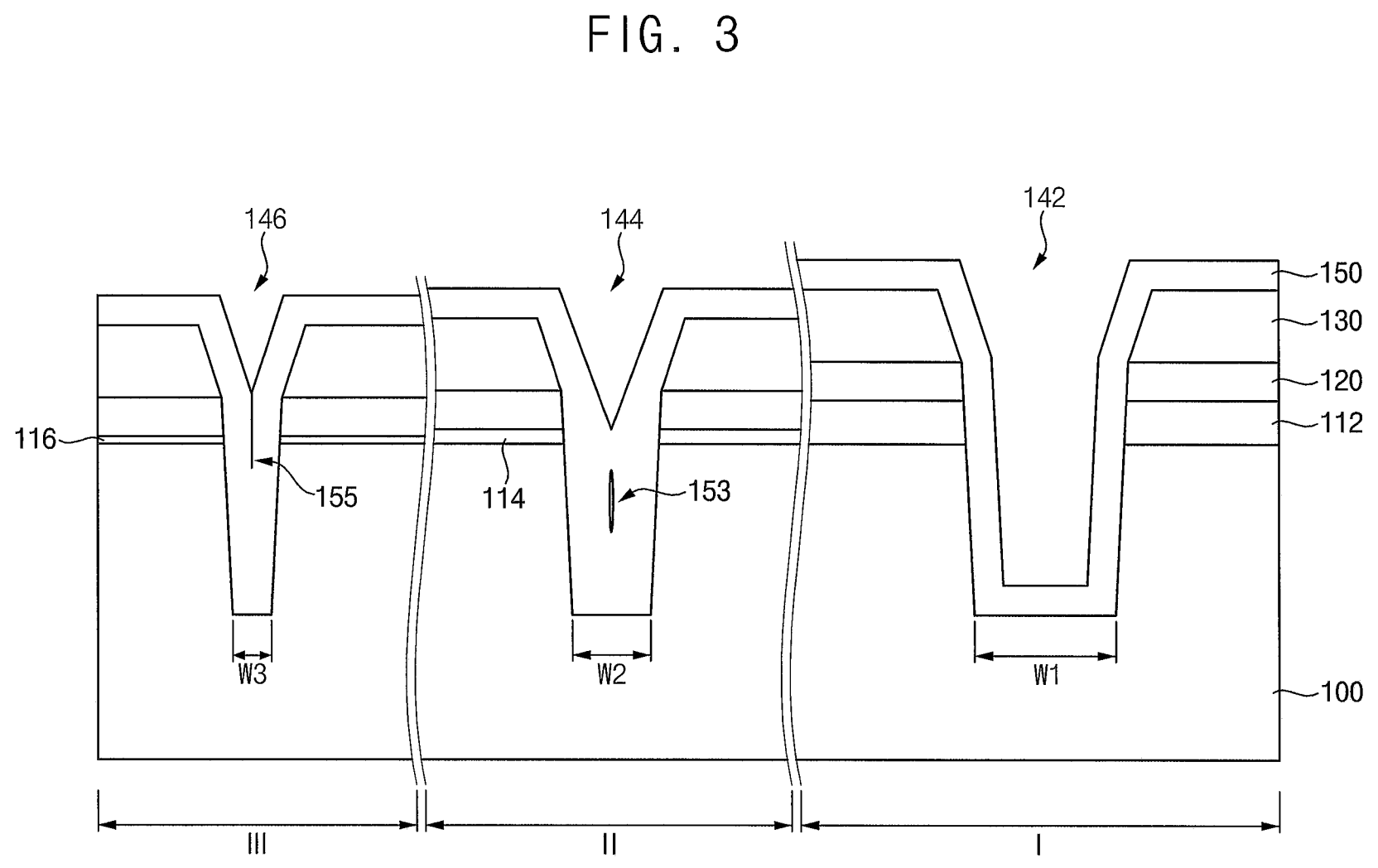

Referring to FIG. 3, a first isolation layer 150 may be formed on inner walls of the first to third trenches 142, 144 and 146 and an upper surface and a sidewall of the mask 130.

In example embodiments, the first isolation layer 150 may be formed by a deposition process, e.g., an atomic layer deposition (ALD) process, a chemical vapor deposition (CVD) process, etc., and may have a constant thickness.

In example embodiments, the first isolation layer 150 may fill an entire portion or a most portion of each of the second and third trenches 144 and 146 having a relatively small width, but may not entirely fill the first trench 142 having a relatively large width. Thus, the first isolation layer 150 may be formed on a bottom and a sidewall of the first trench 142.

In an example embodiment, a void 153 or a seam may be formed in a portion of the first isolation layer 150 filling an inner side (e.g., an inside) of the second trench 144, and a seam 155 may be formed in a portion of the first isolation layer 150 filling the third trench 146. For example, the void 153 may be in a vacuum state, or may be filled with a gas (e.g., a process gas) or air.

Figure 4B:
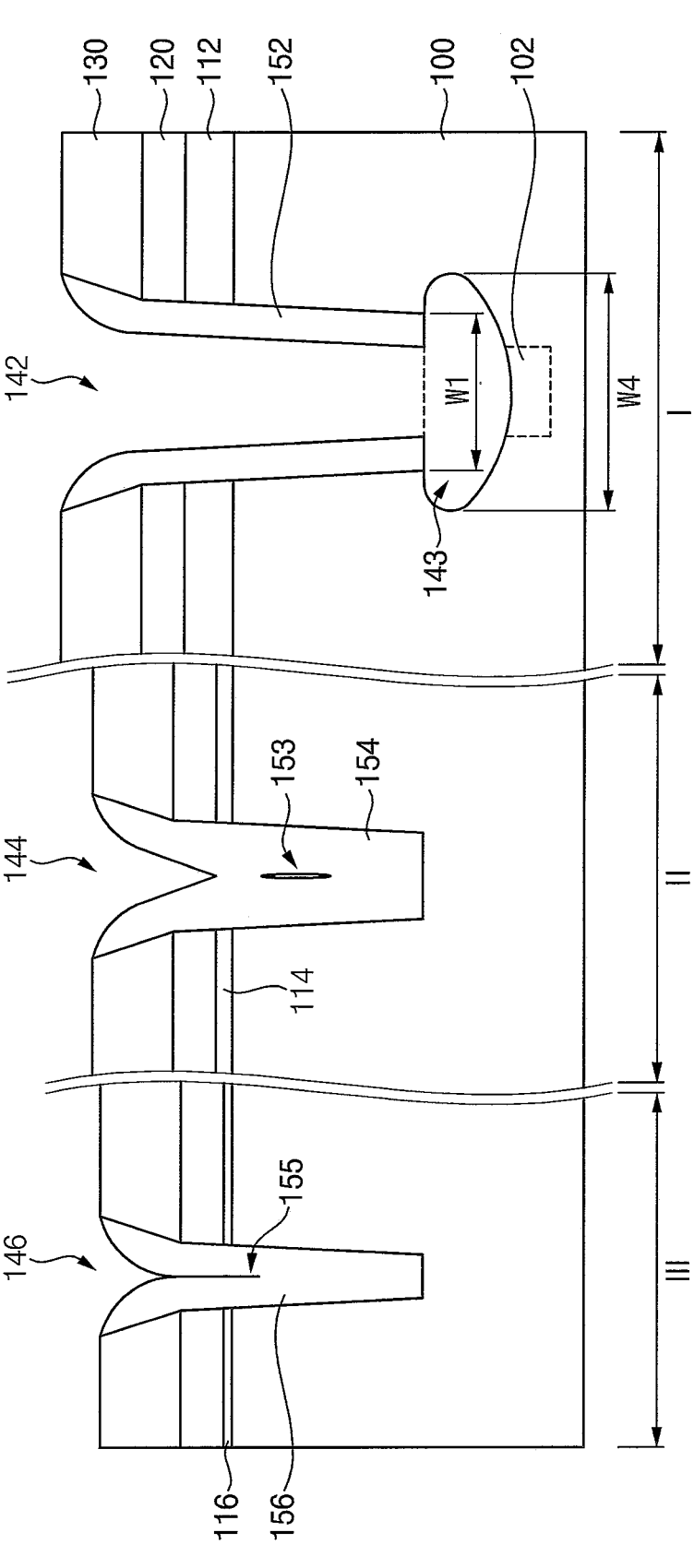

Referring to FIGS. 4A and 4B, the first isolation layer 150 may be partially removed by an anisotropic etching process.

In example embodiments, by the anisotropic etching process, a portion of the first isolation layer 150 on the upper surface of the mask 130 may be entirely removed, and a portion of the first isolation layer 150 on the bottom of the first trench 142 may also be removed to expose a portion of the substrate 100.

Thus, a first isolation pattern 152 may be formed on a sidewall of the first trench 142, and second and third isolation patterns 154 and 156 may be formed in the second and third trenches 144 and 146, respectively.

An ion implantation process may be performed on the exposed portion of the substrate 100 (e.g., on the bottom surface of the first trench 142) in the first region I of the substrate 100 to form an impurity region 102.

In example embodiments, during the ion implantation process, the mask 130 and the first isolation pattern 152 on the sidewall of the first trench 142 may serve as an ion implantation mask. Thus, the impurity region 102 may have a width less than the first width W1 of the first trench 142, and may not be formed in portions of the substrate 100 at opposite sides of the first trench 142. For example, the ion impurity regions may not be formed in sidewalls of the first trench 142 because the first isolation pattern 152 may prevent ions from being implanted into the sidewalls of the first trench 142.

The impurity region 102 exposed by the first trench 142 and a portion of the substrate 100 adjacent thereto may be removed to form a fourth trench 143 connected to the first trench 142. For example, the fourth trench 143 may be integrally formed as one continuous trench with the first trench 142.

In example embodiments, the fourth trench 143 may be formed by an isotropic etching process, and thus not only the impurity region overlapping the first trench 142 in the vertical direction but also a portion of the substrate 100 adjacent thereto in a horizontal direction may be removed to form the fourth trench 143. For example, a portion of the fourth trench 143 may not vertically overlap the first trench 142.

In example embodiments, a fourth width W4 of the fourth trench 143 in a horizontal direction perpendicular to a lengthwise direction of the fourth trench 143 may be greater than the first width W1 of the first trench 142, and thus a lower surface of the first isolation pattern 152 may be exposed by the fourth trench 143. In example embodiments, the fourth trench 143 may have a shape of, e.g., a circle, an ellipse, a polygon, etc., e.g., in a cross-sectional view.

In an example embodiment, the fourth trench 143 may have a flat lower surface as shown in FIG. 4A. Alternatively, the lower surface of the fourth trench 143 may be curved and convex downwardly as shown in FIG. 4B. Hereinafter, for the convenient of explanation, only the fourth trench 143 shown in FIG. 4A is explained below.

Figure 5:
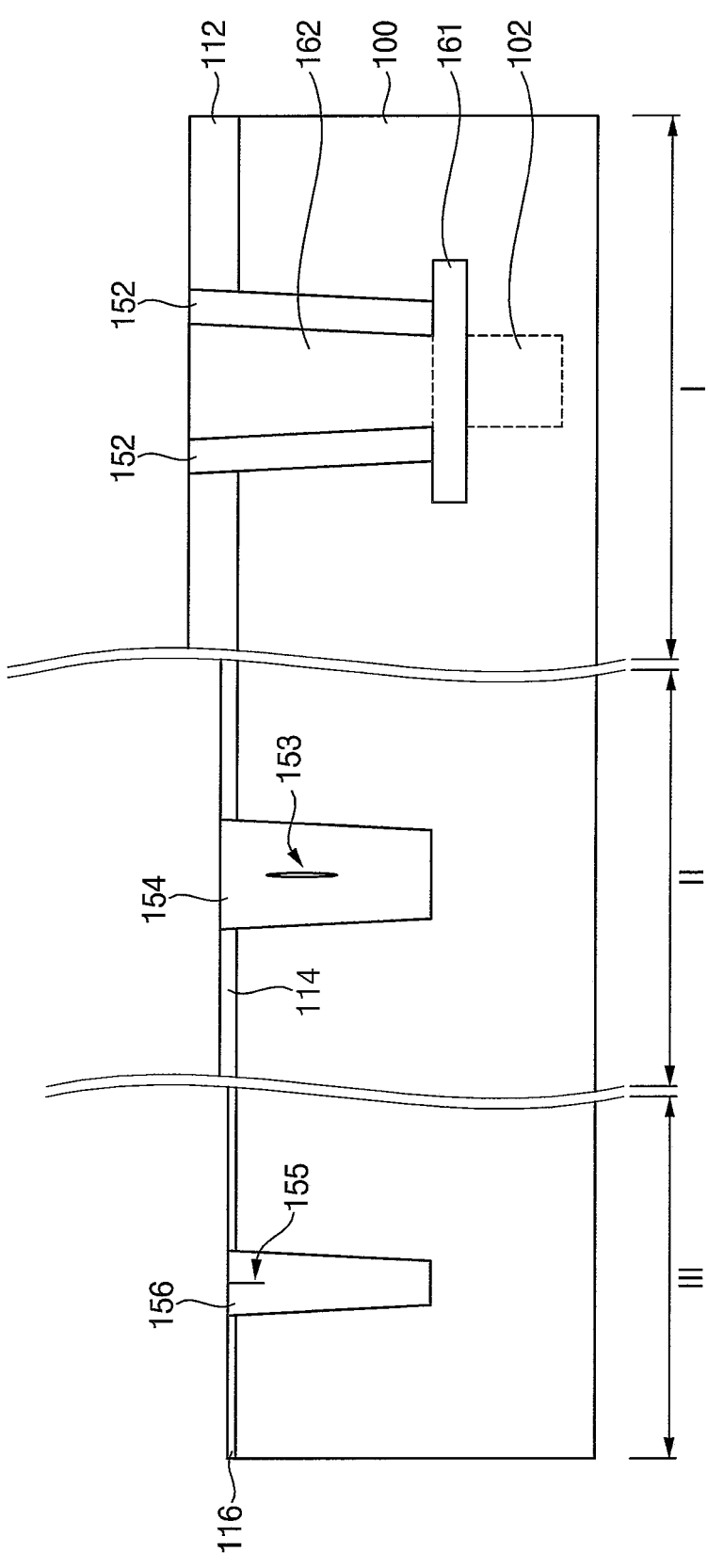

Referring to FIG. 5, a second isolation layer may be formed on the first to third isolation patterns 152, 154 and 156 and the mask 130 to fill the first to fourth trenches 142, 144, 146 and 143, and the second isolation layer, the mask 130, the pad layer 120, and upper portions of the first to third isolation patterns 152, 154 and 156 may be planarized until upper surfaces of the first to third gate insulation layer structures 112, 114 and 116 are exposed.

In example embodiments, the planarization process may include a chemical mechanical polishing (CMP) process and/or an etch back process.

Thus, a fifth isolation pattern 162 and the first isolation pattern 152 covering/contacting a sidewall of the fifth isolation pattern 162 may be formed in the first trench 142, which may form an upper isolation pattern structure. Additionally, a fourth isolation pattern 161 may be formed in the fourth trench 143, and may also be referred to as a lower isolation pattern 161.

The fourth and fifth isolation patterns 161 and 162 may be stacked in the vertical direction and contact each other. The fourth and fifth isolation patterns 161 and 162 may include or be formed of the same or substantially the same material, and thus may be integrally formed, e.g., as one body without boundaries between the fourth and fifth isolation patterns 161 and 162. In example embodiments, the fourth and fifth isolation patterns 161 and 162 may include or be formed of silicon oxide, e.g., USG.

The first, fourth and fifth isolation patterns 152, 161 and 162 in the first and fourth trenches 142 and 143, e.g., the lower isolation pattern 161 and the upper isolation pattern structure may form a first isolation structure.

The second and third isolation patterns 154 and 156 may remain in the second and third trenches 144 and 146, respectively, which may also be referred to as second and third isolation structures, respectively. In an example embodiment, a void 153 or a seam 155 may be formed in the second and third isolation patterns 154 and 156, respectively.

Referring to FIGS. 1A and 1B, a gate electrode layer and a gate mask layer may be sequentially formed on the first to third gate insulation layer structures 112, 114 and 116, the gate mask layer may be patterned to form first to third gate masks (not shown) on the first to third regions I, II and III of the substrate 100, and the gate electrode layer and the first to third gate insulation layer structures 112, 114 and 116 may be patterned using the first to third gate masks as an etching mask.

Thus, a first gate structure 183 including a first gate insulation structure 113 and a first gate electrode 173 stacked in the vertical direction may be formed on the first region I of the substrate 100, a second gate structure 185 including a second gate insulation structure 115 and a second gate electrode 175 stacked in the vertical direction may be formed on the second region II of the substrate 100, and a third gate structure 187 including a third gate insulation structure 117 and a third gate electrode 177 stacked in the vertical direction may be formed on the third region III of the substrate 100.

In an example embodiment, a horizontal width of the second gate structure 185 in a direction perpendicular to a lengthwise direction of the second gate structure 185 may be greater than a horizontal width of the third gate structure 187 in a direction perpendicular to a lengthwise direction of the third gate structure 187, and a horizontal width of the first gate structure 183 in a direction perpendicular to a length-wise direction of the first gate structure 183 may be greater than the horizontal width of the second gate structure 185, however, the inventive concept is not limited thereto.

First to third source/drain regions 193, 195 and 197 may be formed at upper portions of the respective first to third regions I, II and III of the substrate 100 adjacent to the first to third gate structures 183, 185 and 187, respectively. Thus, a first transistor including the first gate structure 183 and the first source/drain regions 193 at opposite sides of the first gate structure 183, a second transistor including the second gate structure 185 and the second source/drains 195 at opposite sides of the second gate structure 185, and a third transistor including the third gate structure 187 and the third source/drain regions 197 at opposite sides of the third gate structure 187 may be formed.

By the above processes, the semiconductor device may be manufactured.

As illustrated in the pictures and as described above, the first isolation pattern 152 may be formed on the sidewall of the first trench 142 having a relatively large width, and an ion implantation process may be performed using the first isolation pattern 152 as a portion of the ion implantation mask, so that the impurity region 102 having a width less than the first width W1 of the first trench 142 may be formed. For example, a thickness of the first isolation pattern 152 on the sidewall of the first trench 142 may be controlled so that the width of the impurity region 102 under the first trench 142 may be adjusted.

When the first isolation pattern 152 is formed in the first trench 142, the second and third isolation patterns 154 and 156 may be formed in the respective second and third trenches 144 and 146 having relatively small widths, and thus, during the ion implantation process, ions may not be implanted into portions of the substrate 100 below and adjacent to the second and third trenches 144 and 146 so as not to be damaged. For example, the second and third isolation patterns 154 and 156 protect the substrate 100 and the second and third gate insulation layer structures 114 and 116 in the vicinity of the second and third trenches 144 and 146 during the implantation process.

The fourth trench 143 having the fourth width W4 that is greater than the first width W1 of the first trench 142 may be further formed under the first trench 142, and thus the lower isolation pattern 161 having a width greater than the width of the upper isolation pattern structure including the first and fifth isolation patterns 152 and 162 may be formed in the fourth trench 143. Accordingly, the impurities in the impurity region 102 under the first trench 142 may be effectively prevented from diffusing into an upper portion of the substrate 100 adjacent to the impurity region 102, e.g., above the lower isolation pattern 161.

Figure 6A:
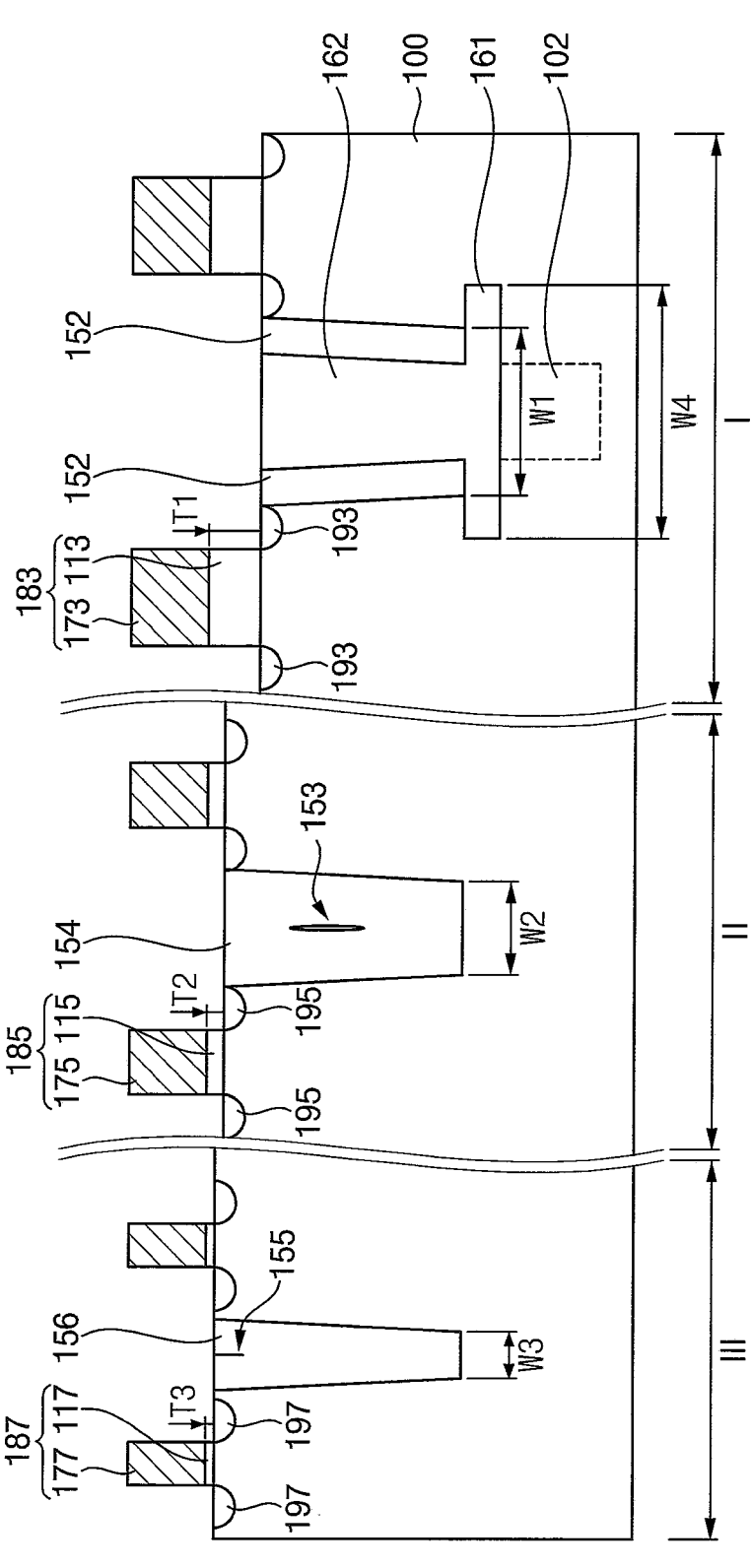
FIGS. 6A and 6B are cross-sectional views illustrating semiconductor devices in accordance with example embodiments.
Figure 6B:
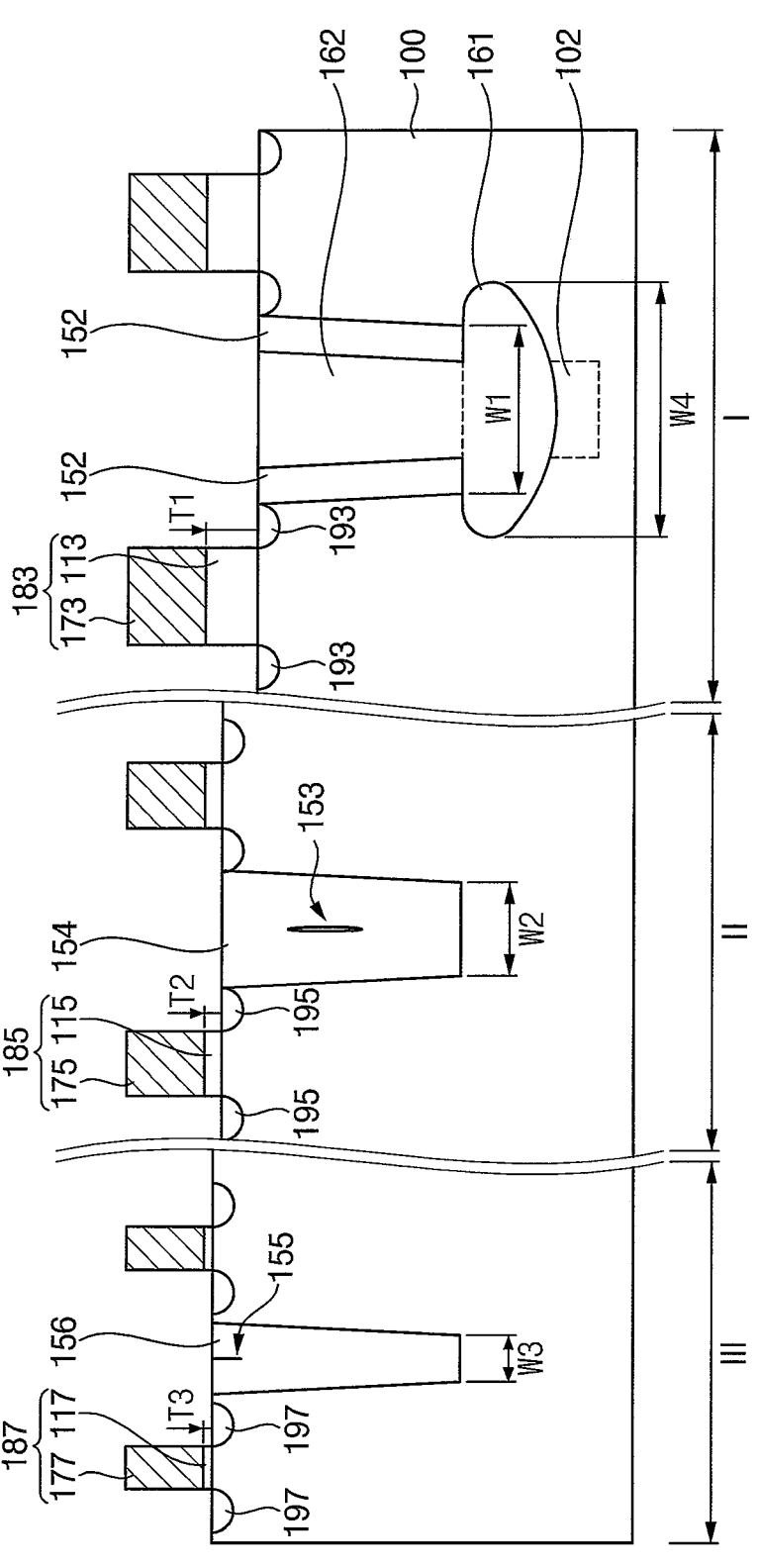

FIGS. 6A and 6B are cross-sectional views illustrating semiconductor devices in accordance with example embodiments. These semiconductor devices may be substantially the same as or similar to those of FIGS. 1A and 1B, except for the locations/levels of the first to third gate insulation structures. Thus, like reference numerals refer to like elements, and repeated explanations thereof are omitted herein.

Referring to FIGS. 6A and 6B, heights of the upper surfaces of the first to third gate insulation structures 113, 115 and 117 may be substantially equal to each other, while heights of the lower surfaces of the first to third gate insulation structures 113, 115 and 117 may increase in this order. For example, the bottom surface of the first gate insulation structure 113 may be at a lower level than the bottom surface of the second gate insulation structure 115, and the bottom surface of the second gate insulation structure 115 may be at a lower level than the bottom surface of the third gate insulation structure 117.

Thus, heights/levels of the upper surfaces of the first to third gate structures 183, 185 and 187 may be substantially equal to each other.

Figure 7:
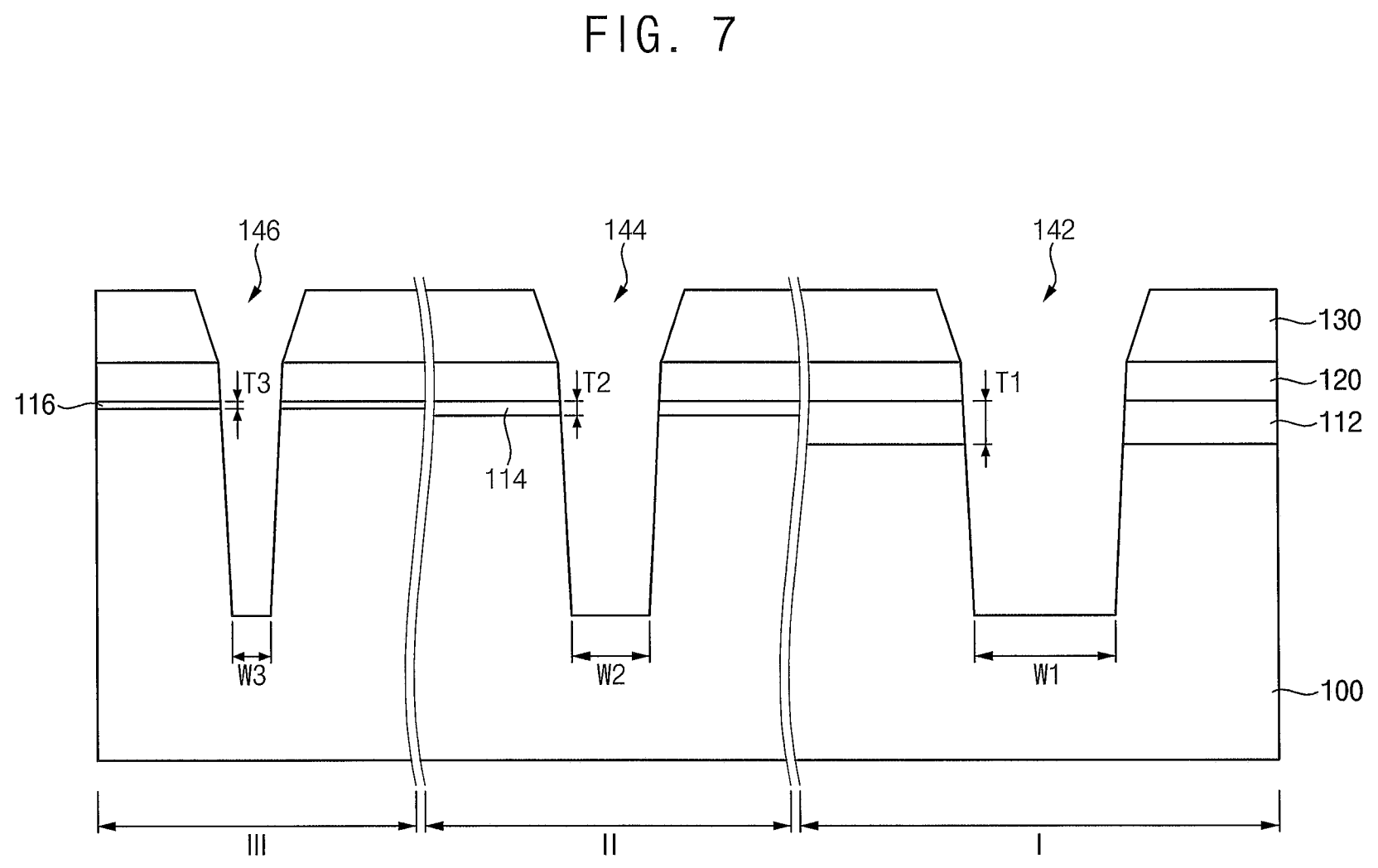

FIG. 7 is a cross-sectional view illustrating a method of manufacturing semiconductor devices in accordance with example embodiments. This method may include processes substantially the same as or similar to those illustrated with reference to FIGS. 2 to 5 and FIGS. 1A and 1B, and thus repeated explanations thereof are omitted herein.

Referring to FIG. 7, processes substantially the same as or similar to those illustrated with reference to FIG. 2 may be performed.

However, the first to third gate insulation layer structures 112, 114 and 116 may be formed on portions of the substrate 100 having different heights/levels from each other.

For example, an upper portion of the second region II of the substrate 100 may be removed to form a fifth trench, and an upper portion of the first region I of the substrate 100 may be removed to form a sixth trench deeper than the fifth trench. For example, an upper portion of the second region II of the substrate 100 may be uniformly removed for the top surface of the second region II of the substrate 100 to be smooth to have substantially uniform level throughout the second region II of the substrate 100, thereby forming the fifth trench throughout the second region II of the substrate 100. For example, an upper portion of the first region I of the substrate 100 may be uniformly removed for the top surface of the first region I of the substrate 100 to be smooth to have substantially uniform level throughout the first region I of the substrate 100, thereby forming the sixth trench throughout the first region I of the substrate 100. For example, the bottom surface of the fifth trench may be at a lower level than the top surface of the third region III of the substrate 100. For example, the bottom surface of the sixth trench may be at a lower level than the bottom surface of the fifth trench.

A gate insulation layer may be formed on the first to third regions I, II and III of the substrate 100 to fill the fifth and sixth trenches, and an upper portion of the gate insulation layer may be planarized.

Thus, the third gate insulation layer structure 116 having the third thickness T3 may be formed on the third region III of the substrate 100, the second gate insulation layer structure 114 having the second thickness T2 greater than the third thickness T3 may be formed on the second region II of the substrate 100 (e.g., in the fifth trench), and the first gate insulation layer structure 112 having the first thickness T1 greater than the second thickness T2 may be formed on the first region I of the substrate 100 (e.g., in the sixth trench).

The pad layer 120 and the mask 130 may be formed on the first to third gate insulation structures 112, 114 and 116, and an etching process may be performed using the mask 130 as an etching mask to form the first to third trenches 142, 144 and 146.

Referring to FIG. 6, processes substantially the same as or similar to those illustrated in and described with reference to FIGS. 3 to 5 and FIGS. 1A and 1B may be performed to complete the fabrication of the semiconductor device.

The semiconductor device may be any of various types of memory devices and/or systems including isolation structures. For example, the semiconductor device may be a logic device such as a central processing unit (CPU), an application processor (AP), etc. Alternatively, the semiconductor device may be a volatile memory device such as a DRAM device, an SRAM device, etc., or a non-volatile memory device such as a flash memory device, a PRAM device, an MRAM device, an RRAM device, etc.

The semiconductor device may be a vertical NAND flash memory device having a cell over periphery (COP) structure.

Even though different figures show variations of exemplary embodiments and different embodiments disclose different features from each other, these figures and embodiments are not necessarily intended to be mutually exclusive from each other. Rather, certain features depicted in different figures and/or described above in different embodiments can be combined with other features from other figures/embodiments to result in additional variations of embodiments, when taking the figures and related descriptions of embodiments as a whole into consideration. For example, components and/or features of different embodiments described above can be interchangeably combined with components and/or features of other embodiments unless the context indicates otherwise.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
a substrate including a first region and a second region;
a first isolation structure extending through an upper portion of the first region of the substrate, the first isolation structure defining a first active region;
an impurity region under the first isolation structure in the substrate;
a first gate structure on the first region of the substrate, the first gate structure having a first thickness in a vertical direction perpendicular to an upper surface of the substrate;
a first source/drain region at an upper portion of the first active region adjacent to the first gate structure;
a second isolation structure extending through an upper portion of the second region of the substrate, the second isolation structure defining a second active region, and the second isolation structure having a void therein;
a second gate structure on the second region of the substrate, the second gate structure having a second thickness in the vertical direction that is less than the first thickness; and
a second source/drain region at an upper portion of the second active region adjacent to the second gate structure,
wherein the first isolation structure includes:
an upper isolation pattern structure including:
a first isolation pattern; and
a second isolation pattern covering a sidewall of the first isolation pattern, the second isolation pattern including an oxide; and
a lower isolation pattern under and contacting the upper isolation pattern structure, a sidewall of the lower isolation pattern contacting the substrate, a width of the lower isolation pattern being greater than a width of a bottom of the upper isolation pattern structure, and
wherein a width of the impurity region is less than a width of the first isolation structure.

2. The semiconductor device as claimed in claim 1, wherein a lower surface of the lower isolation pattern is curved and convex downwardly.

3. The semiconductor device as claimed in claim 1, wherein the lower isolation pattern includes a material the same as a material of the first isolation pattern.

4. The semiconductor device as claimed in claim 1, wherein the first and second isolation patterns and the lower isolation pattern include silicon oxide.

5. The semiconductor device as claimed in claim 1, wherein the impurity region is under the lower isolation pattern in the substrate.

6. The semiconductor device as claimed in claim 5, wherein a width of the impurity region is less than the width of the bottom of the upper isolation pattern structure.

7. The semiconductor device as claimed in claim 1, wherein
the second isolation structure includes a third isolation pattern.

8. The semiconductor device as claimed in claim 7, wherein the third isolation pattern includes a material the same as a material of the second isolation pattern.

9. The semiconductor device as claimed in claim 7, wherein a width of the third isolation pattern is less than the width of the upper isolation pattern structure.

10. The semiconductor device as claimed in claim 7, wherein a lower surface of the third isolation pattern is substantially coplanar with a lower surface of the upper isolation pattern structure.

11. The semiconductor device as claimed in claim 7, wherein a void or seam is formed in the third isolation pattern.

12. The semiconductor device as claimed in claim 7, wherein:
the first gate structure includes a first gate insulation structure and a first gate electrode stacked in a vertical direction perpendicular to an upper surface of the substrate,
the second gate structure includes a second gate insulation structure and a second gate electrode stacked in the vertical direction, and
a thickness of the first gate insulation structure in the vertical direction is greater than a thickness of the second gate insulation structure in the vertical direction.

13. The semiconductor device as claimed in claim 1, wherein the first gate structure and the first source/drain region forms a first transistor, and the second gate structure and the second source/drain region forms a second transistor, and
wherein the semiconductor device is configured such that a maximum of a voltage applied to the first transistor is greater than a maximum of a voltage applied to the second transistor.

14. A semiconductor device, comprising:
a substrate including a first region, a second region and a third region;
a first isolation structure extending through an upper portion of the first region of the substrate, the first isolation structure defining a first active region;
an impurity region under the first isolation structure in the substrate;
a first gate structure on the first region of the substrate, the first gate structure having a first thickness in a vertical direction perpendicular to an upper surface of the substrate;
a first source/drain region at an upper portion of the first active region adjacent to the first gate structure;
a second isolation structure extending through an upper portion of the second region of the substrate, the second isolation structure defining a second active region, and the second isolation structure having a void therein;
a second gate structure on the second region of the substrate, the second gate structure having a second thickness in the vertical direction that is less than the first thickness;
a second source/drain region at an upper portion of the second active region adjacent to the second gate structure;
a third isolation structure extending through an upper portion of the third region of the substrate, the third isolation structure defining a third active region, and the third isolation structure having a seam therein;
a third gate structure on the third region of the substrate, the third gate structure having a third thickness in the vertical direction that is less than the second thickness; and
a third source/drain region at an upper portion of the third active region adjacent to the third gate structure,
wherein the first isolation structure includes:
an upper isolation pattern structure; and a lower isolation pattern under and contacting the upper isolation pattern structure, a sidewall of the lower isolation pattern contacting the substrate, a width of the lower isolation pattern being greater than a width of a bottom of the upper isolation pattern structure, and wherein a width of the impurity region is less than a width of the first isolation structure.

15. The semiconductor device as claimed in claim 14, wherein a width of the second isolation structure is greater than a width of the third isolation structure, and a width of a bottom of the first isolation structure is greater than the width of the bottom of the second isolation structure.

16. The semiconductor device as claimed in claim 14, wherein the upper isolation pattern structure includes:

a first isolation pattern; and a second isolation pattern covering a sidewall of the first isolation pattern.

17. The semiconductor device as claimed in claim 14, wherein a lower surface of the lower isolation pattern is curved and convex downwardly.

* * * * *